(12) United States Patent
Xu

(10) Patent No.: US 11,594,579 B2
(45) Date of Patent: Feb. 28, 2023

(54) DISPLAY SUBSTRATES, DISPLAY DEVICES AND METHODS OF FORMING DISPLAY SUBSTRATES AND DEVICES

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Jian Xu, Beijing (CN)

(73) Assignees: Beijing BOE Technology Development Co., Ltd., Beijing (CN); BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/755,481

(22) PCT Filed: Nov. 1, 2019

(86) PCT No.: PCT/CN2019/115085
§ 371 (c)(1),
(2) Date: Apr. 10, 2020

(87) PCT Pub. No.: WO2020/093948
PCT Pub. Date: May 14, 2020

(65) Prior Publication Data
US 2021/0305330 A1    Sep. 30, 2021

(30) Foreign Application Priority Data
Nov. 5, 2018    (CN) .......................... 201821813897.X

(51) Int. Cl.
*H01L 27/32* (2006.01)
*H01L 51/56* (2006.01)

(52) U.S. Cl.
CPC ...... *H01L 27/3218* (2013.01); *H01L 27/3216* (2013.01); *H01L 27/3246* (2013.01); *H01L 51/56* (2013.01); *H01L 2227/323* (2013.01)

(58) Field of Classification Search
CPC .................. H01L 27/3216; H01L 27/3218
See application file for complete search history.

(56) References Cited

U.S. PATENT DOCUMENTS 11,049,920 B1 *   6/2021   Zhao .................... H01L 27/3216
11,114,507 B2 *   9/2021   Wang .................... H01L 27/326
(Continued)

FOREIGN PATENT DOCUMENTS

CN    104659069 A    5/2015
CN    108091667 A    5/2018
(Continued)

OTHER PUBLICATIONS

Machine translation, Yu, Chinese Pat. Pub. No. CN 108091667A, translation date Sep. 9, 2021, Espacenet, all pages. (Year: 2021).*
(Continued)

*Primary Examiner* — Victoria K. Hall
(74) *Attorney, Agent, or Firm* — McCoy Russell LLP

(57) ABSTRACT

The present application provides a display substrate, the display substrate including a plurality of sub-pixel units, the plurality of sub-pixel units arranged in a plurality of rows and columns, wherein the plurality of columns of the sub-pixel units include alternatingly disposed solid color sub-pixel unit columns and mixed color sub-pixel unit columns, the solid color sub-pixel unit columns including a plurality of sub-pixel units corresponding to the same color, and in the mixed color sub-pixel unit columns, adjacent two sub-pixel units correspond to different colors. In the same row of sub-pixel units, the sub-pixel units on both sides of the sub-pixel unit in the solid color sub-pixel unit column have (Continued)

different colors. The utility model also provides a display device. The display device does not appear jagged or blurred when displaying an image.

11 Claims, 6 Drawing Sheets

(56) References Cited

U.S. PATENT DOCUMENTS

| | | | |
|---|---|---|---|
| 2006/0125381 A1* | 6/2006 | Oh | H01L 27/3246 313/504 |
| 2006/0170712 A1 | 8/2006 | Miller et al. | |
| 2011/0180821 A1* | 7/2011 | Matsushima | H01L 27/3246 438/34 |
| 2011/0198596 A1* | 8/2011 | Park | H01L 27/3246 438/34 |
| 2012/0313844 A1* | 12/2012 | Im | H01L 27/3218 438/34 |
| 2013/0057521 A1* | 3/2013 | Kim | H01L 27/3216 345/204 |
| 2013/0234590 A1* | 9/2013 | Li | H01L 27/3246 445/24 |
| 2013/0234917 A1* | 9/2013 | Lee | H01L 27/3218 345/82 |
| 2014/0008618 A1* | 1/2014 | Lim | H01L 51/5268 438/23 |
| 2014/0061605 A1* | 3/2014 | Kim | H01L 51/5271 257/40 |
| 2014/0071030 A1* | 3/2014 | Lee | H01L 27/3218 345/82 |
| 2014/0306198 A1* | 10/2014 | Im | H01L 27/3216 257/40 |
| 2016/0078807 A1* | 3/2016 | Sun | G09G 3/3233 345/204 |
| 2016/0240592 A1* | 8/2016 | Li | H01L 27/3216 |
| 2016/0240593 A1* | 8/2016 | Gu | H01L 27/3262 |
| 2016/0240594 A1* | 8/2016 | Zhu | H01L 27/3218 |
| 2017/0148865 A1 | 5/2017 | Cho et al. | |
| 2017/0194398 A1* | 7/2017 | Kim | H01L 27/3218 |
| 2017/0278905 A1* | 9/2017 | Hsu | H01L 27/3216 |
| 2017/0287988 A1* | 10/2017 | Lee | H01L 27/3218 |
| 2017/0309688 A1* | 10/2017 | Lee | H01L 27/3216 |
| 2017/0317145 A1* | 11/2017 | Hong | G06F 3/0446 |
| 2018/0076270 A1* | 3/2018 | Kwon | H01L 27/3258 |
| 2018/0097043 A1* | 4/2018 | Song | H01L 27/3246 |
| 2018/0174511 A1* | 6/2018 | Kim | G09G 3/3233 |
| 2018/0254304 A1* | 9/2018 | Hong | H01L 51/5209 |
| 2019/0035861 A1* | 1/2019 | Wang | H01L 27/32 |
| 2019/0074329 A1* | 3/2019 | Kim | H01L 27/3276 |
| 2019/0097167 A1* | 3/2019 | Sun | H01L 51/5256 |
| 2019/0131355 A1* | 5/2019 | Chae | H01L 27/3258 |
| 2019/0165061 A1* | 5/2019 | Jung | H01L 27/3218 |
| 2019/0172877 A1* | 6/2019 | Kim | H01L 27/3218 |
| 2019/0213956 A1* | 7/2019 | Park | H01L 27/3213 |
| 2019/0237524 A1* | 8/2019 | Chen | H01L 51/525 |
| 2019/0252469 A1* | 8/2019 | Xiao | H01L 27/3216 |
| 2019/0280061 A1* | 9/2019 | Joo | H01L 27/3262 |
| 2019/0311683 A1* | 10/2019 | Park | G09G 3/2003 |
| 2019/0340959 A1* | 11/2019 | Park | G06F 3/0412 |
| 2019/0355794 A1* | 11/2019 | Dai | H01L 27/3218 |
| 2020/0075698 A1* | 3/2020 | Yang | H01L 27/3258 |
| 2020/0212127 A1* | 7/2020 | Choi | H01L 51/0097 |
| 2020/0357861 A1* | 11/2020 | Wang | H01L 27/3216 |
| 2020/0365665 A1* | 11/2020 | Choi | H01L 27/3276 |
| 2020/0395422 A1* | 12/2020 | Xu | H01L 51/5072 |

FOREIGN PATENT DOCUMENTS

| | | |
|---|---|---|
| CN | 108511480 A | 9/2018 |
| CN | 208753326 U | 4/2019 |
| EP | 2637209 A1 | 9/2013 |

OTHER PUBLICATIONS

Machine translation, Liu, Chinese Pat. Pub. No. CN 108511480A, translation date Sep. 9, 2021, Espacenet, all pages. (Year: 2021).*
Machine translation, Li, Chinese Pat. Pub. No. CN 104659069A, translation date Sep. 9, 2021, Espacenet, all pages. (Year: 2021).*
ISA National Intellectual Property Administration of the People's Republic of China, International Search Report Issued in Application No. PCT/CN2019/115085, dated Feb. 5, 2020, WIPO, 3 pages.
ISA National Intellectual Property Administration of the People's Republic of China, Written Opinion of the International Searching Authority Issued in Application No. PCT/CN2019/115085, dated Feb. 5, 2020, WIPO, 4 pages.
European Patent Office, Extended European Search Report Issued in Application No. 19882023.5, dated Oct. 21, 2022, Germany, 12 pages.

* cited by examiner

DISPLAY SUBSTRATES, DISPLAY DEVICES AND METHODS OF FORMING DISPLAY SUBSTRATES AND DEVICES

CROSS-REFERENCE TO RELATED APPLICATION

The present application is a U.S. National Phase of International Patent Application Serial No. PCT/CN2019/115085 entitled, "DISPLAY SUBSTRATES, DISPLAY DEVICES AND METHODS OF FORMING DISPLAY SUBSTRATES AND DEVICES", filed on Nov. 1, 2019. International Patent Application Serial No. PCT/CN2019/115085 claims priority to Chinese Patent Application No. 201821813897.X, filed on Nov. 5, 2018. The entire contents of each of the above-referenced applications are hereby incorporated by reference for all purposes.

TECHNICAL FIELD

The present application relates to the field of display devices and display substrates including a plurality of sub-pixel units.

BACKGROUND AND SUMMARY

A large percentage of modern electronic devices are fitted with an organic light-emitting diode (OLED) display. OLEDs have gained popularity based on advantageous properties including small thickness, wide viewing angle, fast response speed, and high luminous efficiency. A display device, such as an OLED display device, includes a plurality of sub-pixel units arranged in an array, and different images are displayed by controlling the illumination of the respective sub-pixel units. The sub-pixels are the fundamental sub-systems (such as a building blocks) for constituting the pixels in the display. Each sub pixel may correspond to a single color, such as blue, red, or green. A plurality of sub-pixel units may form a pixel. As an example, a red sub-pixel, a blue sub-pixel, and a green sub-pixel may together form a single pixel (RBG). In alternate systems, other color combinations are also possible.

However, when an edge of an image is displayed by the display device, simultaneous illumination of a plurality of sub-pixel units may cause a pixel unit outside the edge of the image to emit light, or a pixel unit in the edge may not emit light, thereby causing an undesired image boundary module. In one example, it may be proposed to increase the pixels per inch (PPI) of a display substrate (the number of sub-pixel units per inch). However PPI can only be increased up to a certain limit. Also, the PPI of a display device is often limited by process conditions, and altering the process conditions may involve higher cost.

Manufacturing a display device with a desirable display effect under the existing process conditions is a technical challenge to be solved in the art.

It is an object of the present application to provide a display substrate and a display device including a display substrate. An embodiment of a display device including the display substrate can achieve a desirable display effect while also reducing manufacturing cost. A display substrate may be the layer in the display device on which the image is displayed. A plurality of pixels formed of sub-pixels are arranged on the substrate. Electronic components of the device are coupled to the substrate. In one example, the substrate may be a flexible substrate made of a polymeric material. Display substrates may also be a glass substrate.

In order to achieve the above object, as one aspect of the present application, a display substrate is provided, the display substrate including a plurality of sub-pixel units, the plurality of sub-pixel units are arranged in an array of a plurality of rows and columns. The array of sub-pixel units includes an alternatingly arranged solid color sub-pixel unit column and a mixed color sub-pixel unit column, the solid color sub-pixel unit column including a plurality of sub-pixel units corresponding to the same color, adjacent to the mixed color sub-pixel unit column. The color corresponding to any two adjacent sub-pixel units is different, and in the same row of sub-pixel units, the mixed color sub-pixel units on both sides of a pure color sub-pixel unit may have different colors.

As an example system, the solid color sub-pixel unit columns comprise green sub-pixel units corresponding to green color, and the mixed color sub-pixel unit columns comprise alternating red sub-pixel units corresponding to red color and blue sub-pixel units corresponding to blue color. In any preceding example, additionally or optionally, an area of a green sub-pixel unit is smaller than an area of a red sub-pixel unit, and an area of a green sub-pixel unit is smaller than an area of a blue sub-pixel unit area. In any or all of the preceding examples, additionally or optionally, an opening shape of the green sub-pixel unit is a rectangle or an ellipse, an angle formed between a long axis of the ellipse and a column direction, and a direction of a long axis of any one of the green sub-pixel units is opposite to a direction of a long axis of an adjacent green sub-pixel unit. In any or all of the preceding examples, additionally or optionally, the area of the red sub-pixel unit is smaller than the area of the blue sub-pixel unit, and wherein each of an opening shape of the red sub-pixel unit and an opening shape of the blue sub-pixel unit are rectangular. In any or all of the preceding examples, additionally or optionally, the display substrate comprises a pixel defining layer having a plurality of sub-pixel openings, the plurality of the sub-pixel openings being in one-to-one correspondence with the plurality of sub-pixel units, wherein each of the sub-pixel units comprise an organic light emitting diode and at least a portion of the organic light emitting diode is located in the corresponding sub-pixel opening. In any or all of the preceding examples, additionally or optionally, the organic light emitting diode includes one or more functional layers deposited on each of a bottom wall and a sidewall of the sub-pixel opening. In any or all of the preceding examples, additionally or optionally, an opening area of a lower portion of the sub-pixel opening does not exceed an opening area of an upper portion of the sub-pixel opening. In any or all of the preceding examples, additionally or optionally, the sidewall of the sub-pixel opening has a slope angle of between 200 and 40° with the bottom wall of the sub-pixel opening. In any or all of the preceding examples, additionally or optionally, the sidewall of the sub-pixel opening has a slope angle of between 26° and 27° with the bottom wall of the sub-pixel opening. In any or all of the preceding examples, additionally or optionally, a ratio of the opening area of the upper portion of the sub-pixel opening to the opening area of the lower portion of the sub-pixel opening is between 1 and 1.6. In any or all of the preceding examples, additionally or optionally, the organic light emitting diode includes a red organic light emitting diode, a green organic light emitting diode, and a blue organic light emitting diode, wherein a ratio of an opening area of an upper portion of a sub-pixel opening corresponding to the red organic light-emitting diode to an opening area of a lower portion of the sub-pixel opening corresponding to the red organic light emitting diode is between 1.45 and 1.55, wherein a ratio of an opening area of an upper portion of a sub-pixel opening corresponding to the blue organic light-emitting diode to an opening area of a lower portion of the sub-pixel opening corresponding to the blue organic light emitting diode is between 1.45 and 1.55; and wherein a ratio of an opening area of an upper portion of a sub-pixel opening corresponding to the green organic light-emitting diode to an opening area of a lower portion of the sub-pixel opening corresponding to the green organic light emitting diode is between 1.2 and 1.3. In any or all of the preceding examples, additionally or optionally, in a pixel unit, at least one sub-pixel units has a relationship with at least one sub-pixel unit of a different color of an adjacent row, the relationship including a pitch of two sub-pixel units in a row direction being smaller than a pitch of the two sub-pixel units in a column direction and wherein in the pixel unit, at least one sub-pixel unit is a green sub-pixel unit, and the at least one sub-pixel unit of a different color is a blue sub-pixel unit or a red sub-pixel unit. In any or all of the preceding examples, additionally or optionally, the pixel unit includes the green sub-pixel unit, the red sub-pixel unit, and the blue sub-pixel unit, and the green sub-pixel unit has the relationship with each of the red sub-pixel unit and the blue sub-pixel unit.

Another example method for fabricating a display for a display device, comprises: disposing each of a hole transport layer, a light emitting layer, an electron transport layer, and a cathode of an organic light emitting diode (OLED) within a sub-pixel opening on a pixel defining layer of a substrate; and disposing an anode of the OLED below the pixel defining layer, the cathode electrically connected to the anode at the pixel defining layer; wherein deposition within the sub-pixel opening includes deposition on a bottom wall of the sub-pixel opening and a sidewall of the sub-pixel opening, the sidewall being at an angle with the bottom wall.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure. Additionally, the summary above does not constitute an admission that the technical problems and challenges discussed were known to anyone other than the inventors.

BRIEF DESCRIPTION OF THE FIGURES

The drawings are intended to provide a further understanding of the application, and are intended to be a part of the description of the application.

DETAILED DESCRIPTION

Figure 1:
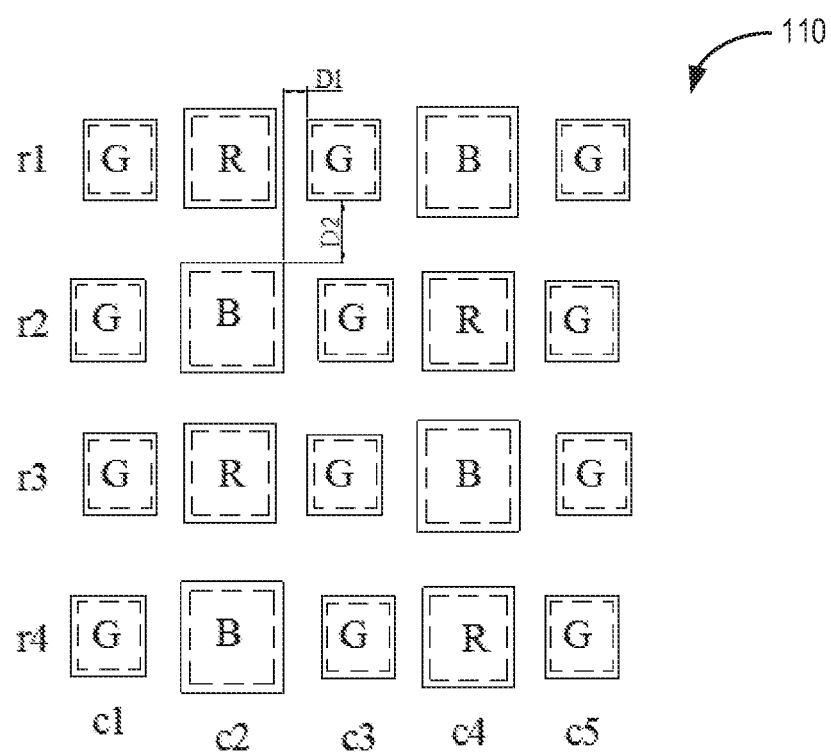
FIG. 1 is a schematic diagram showing a first arrangement of sub-pixel units in a display substrate provided by the present application.

The specific embodiments of the present application will be described in detail below with reference to the accompanying drawings. It is understood that the specific embodiments described herein are merely illustrative of the application and are not intended to limit the application.

A conventional display substrate may have edge blur or a saw-tooth shape when displayed since the display substrate includes a plurality of pixel units, each of the pixel units includes a plurality of sub-pixel units, and the plurality of sub-pixel units are sequentially arranged in a row direction, and the color of the pixel units in the same column is the same. During illumination of an image on a display, a plurality of pixel units are simultaneously illuminated. Each pixel unit comprises a plurality of sub-pixel units. When an image is displayed, each of the sub-pixel units in the driving pixel units emit light. Since an illumination mode therein is fixed, when an edge is displayed, the simultaneous illumination of the plurality of sub-pixel units causes sub-pixel units (or even one or more pixel units) outside the edge of the image to emit light. Similarly, sub-pixel units (or even one or more pixel units) at or within the edge may not emit light. Due to over illumination or under illumination of sub-pixels units at the edge of an image, undesirable distortions such as a saw-tooth may be formed at the image edge.

In view of this, as one aspect of the present application, a display substrate is provided. As shown in the display substrate 110 in FIG. 1, display substrate 220 in FIG. 2A, display substrate 270 in FIG. 2B, and display substrate 290 in FIG. 2C, each of the display substrates includes a plurality of sub-pixel units, and the plurality of sub-pixel units are arranged in a plurality of rows and columns. The plurality of columns of the sub-pixel units include alternatingly disposed solid color sub-pixel unit columns 210 and mixed color sub-pixel unit columns 212 and 214, the solid color sub-pixel unit columns 210 including a plurality of sub-pixel units corresponding to the same color, and the mixed color sub-pixel unit columns 212 and 214 including a plurality of sub-pixel units of alternating color.

Figure 2A:
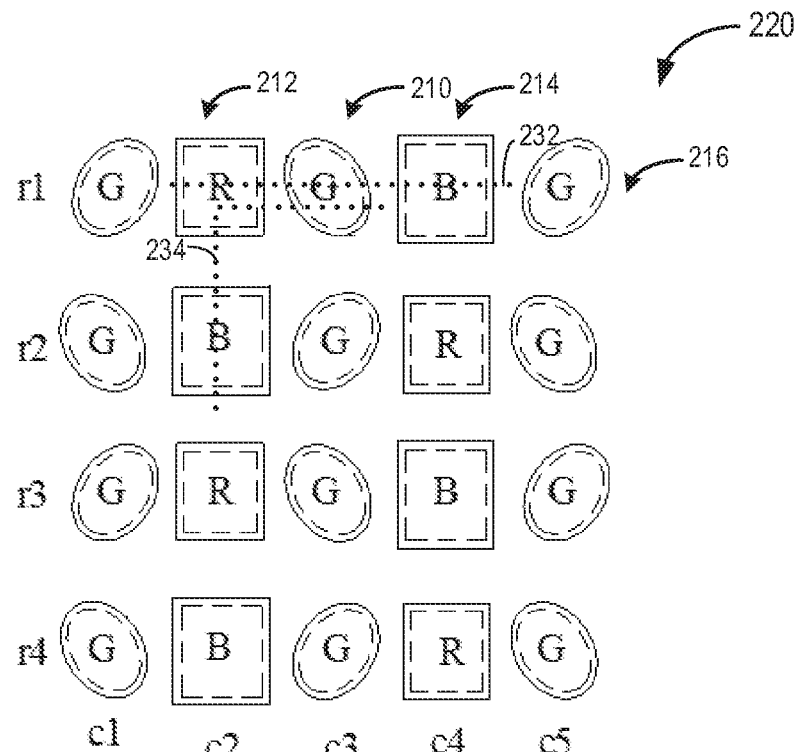
FIG. 2A is a schematic diagram showing a second arrangement of sub-pixel units in the display substrate provided by the present application.
Figure 2B:
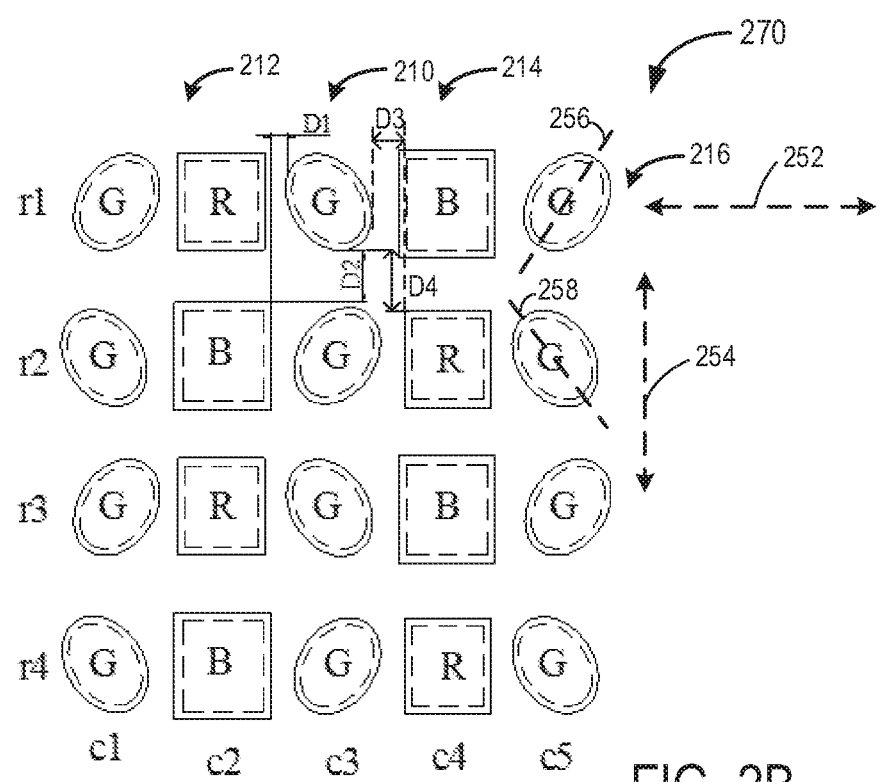
FIG. 2B shows a schematic diagram showing the second arrangement of sub-pixel units showing row and column pitches.
Figure 2C:
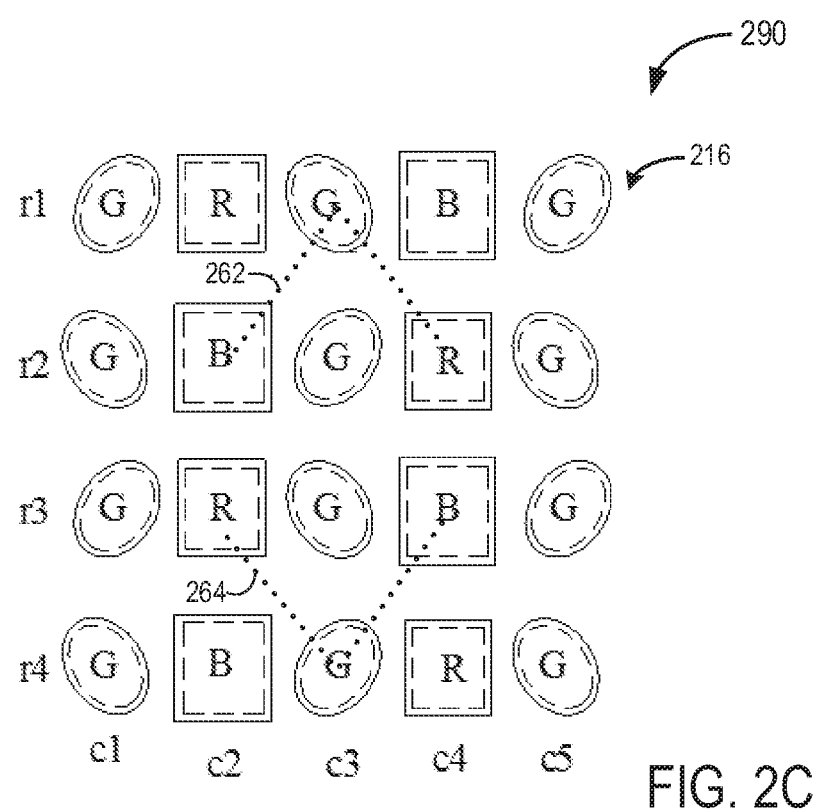
FIG. 2C shows a schematic diagram showing the second arrangement of sub-pixel units forming pixel units.

In the examples shown in FIGS. 2A-C, the solid color sub-pixel unit column 210 may comprise solely green sub-pixel units. The mixed color sub-pixel unit columns 212 to the left of the solid color sub-pixel unit column 210 may comprise alternate rows of red sub-pixel units and blue sub-pixel units. The mixed color sub-pixel unit columns 214 to the right of the solid color sub-pixel unit column 210 may comprise alternate rows of blue sub-pixel units and red sub-pixel units. In a mixed color sub-pixel unit column (such as column 212, 214), the colors of the adjacent two sub-pixel units are different, and in the same row of sub-pixel units (such as row 216), the sub-pixel units on both sides of a sub-pixel unit in the solid color sub-pixel unit column has different colors. As an example, a green sub-pixel unit (being part of a solid color sub-pixel unit column 210) may have a red pixel unit on one side and a blue sub-pixel unit on another side.

In the display substrate provided by the present application, as an example, the sub-pixel unit in the column of the solid color pixel unit may be combined with the adjacent sub-pixel units in the same row or otherwise to form one pixel unit for illumination. When displaying a display panel including the display substrate, it may be determined which sub-pixel units constitute one pixel unit according to the sub-pixel unit through which the edge of the image passes.

In the present application, the type of color of the sub-pixel unit in the display substrate is not limited. For example, the display substrate may include sub-pixel units of three colors, such as a red sub-pixel unit, a green sub-pixel unit, and a blue sub-pixel unit, respectively. Alternatively, the display substrate may further include sub-pixel units of four colors, such as a red sub-pixel unit, a green sub-pixel unit, a blue sub-pixel unit, a white sub-pixel unit (or a yellow sub-pixel unit, a cyan sub-pixel unit, a magenta sub-pixel unit, etc.).

In the embodiment shown in FIGS. 1 and 2A-C, the display substrate includes a red sub-pixel unit R corresponding to red, a green sub-pixel unit G corresponding to green, and a blue sub-pixel unit corresponding to blue B. In some examples, the solid color sub-pixel unit column includes green sub-pixel units corresponding to green, and the mixed color sub-pixel unit columns include red sub-pixel units corresponding to red and blue sub-pixel units corresponding to blue.

In the display substrate 110 in FIG. 1, each of the green sub-pixel units, the red sub-pixel units, and the blue sub-pixel units are rectangular in shape. The area of the green sub-pixel may be smaller than the areas of each of the blue sub-pixel unit and the green sub-pixel unit, and the area of the red sub-pixel unit is each of bigger than that of the green sub-pixel unit and smaller than that of the blue sub-pixel unit.

In the display substrates 270 and 290 in FIGS. 2B-C, the opening shape of the green sub-pixel unit is an ellipse. There is an angle between a long axis 256 of the ellipse and the column direction 254. In one example, the angle between the long axis of the ellipse and the vertical column direction is between 10° and 45°.

The direction of the long axis 256 of any one of the green sub-pixel units is opposite to the direction of the long axis 258 of the green sub-pixel unit adjacent to the green sub-pixel unit. Said another way, if the first long axis 256 of a first green sub-pixel points to a first direction, the long axes (such as long axis 258) of each of the green sub-pixels surrounding the first green sub-pixel points point to a second direction, the second direction opposite to the first direction. Taking a green sub-pixel unit of the r2 row c3 column as an example (first green sub-pixel), the green sub-pixel units around it are a green sub-pixel unit at row r1×column c3, a green sub-pixel unit at row r2×column c1, a green sub-pixel unit at row r2×column c5 column, and a green sub-pixel unit at row r3×column c3 column. As can be seen from the figure, the long axis of the green sub-pixel unit of at row r1×column c3, the long axis of the green sub-pixel unit at row r2×column c1, the long axis of the green sub-pixel unit at the row r2×column c5, and the long axis of the green sub-pixel unit at the row r3×column c3 have the same tilt direction such as along the direction from the upper left to the lower right). In contrast, the long axis direction of the first green sub-pixel unit at the row r2×column c3 extend from the upper right to the lower left.

As described above, the sub-pixel unit includes a pixel circuit and an OLED. The sub-pixel units of obliquely adjacent or laterally adjacent different rows may be combined into one pixel unit. The row pitch and column pitch of the OLED are determined by the row pitch and the column pitch of the sub-pixel circuit. The pitch of the two sub-pixel units in a row direction is the distance between the adjacent edges of two sub-pixels in adjacent rows and pitch of the two sub-pixel units in a column direction is the distance between the adjacent edges of two sub-pixels in adjacent rows.

In an example first embodiment, as shown in FIG. 2A, when displaying on the display panel including the display substrate, the sub-pixel units in the same row may constitute one pixel unit. For example, a red sub-pixel unit at row r1×column c2, a green sub-pixel unit at row r1×column c3, and a blue sub-pixel unit at row r1×column c4 form a first pixel unit (RGB) as shown by dotted line 232. For another example, the red sub-pixel unit at the row r1×column c2, the blue sub-pixel unit at the row r2×column c2, and the green sub-pixel unit at the row r1×column c3 may constitute a second pixel unit as shown by dotted line 234. When the display panel is driven for display, the position of the sub-pixel unit constituting the pixel unit can be determined according to a specific shape of an image. In the first embodiment, the adjacent RBG sub-pixel units do not need to satisfy any relationship (other than being the closest neighbors in a matrix of sub-pixels) to form a pixel.

In an example second embodiment, as shown in FIGS. 2B-C, in order for a group of sub-pixels to form a pixel, at least one sub-pixel needs to satisfy a relationship with at least one sub-pixel unit of a different color of an adjacent row. The relationship may include, a pitch of the two sub-pixel units in a row direction (as shown by arrow 252) being less than a pitch of the two sub-pixel units in a column direction (as shown by arrow 254).

As an example, the at least one of the sub-pixel units is a green sub-pixel unit, and the at least one sub-pixel unit of a different color is a blue sub-pixel unit or a red sub-pixel unit. As shown in FIG. 2B, the pitch in the row direction 252 between the green sub-pixel unit G of the r1 row×c3 column and the blue sub-pixel unit B at the row r2×column c2 column is D1. The distance between (the edges of) the G and the blue sub-pixel unit B at the row r2×column c2 in the column direction 254 is D2, where D2>D1. Similarly, the pitch in the row direction between the green sub-pixel unit G at the row r1×column c3 and the red sub-pixel unit R at the row r2×column c4 is D3. The distance between the G and the red sub-pixel unit R at the row r2×column c4 column in the column direction is D4, where D4>D3. Therefore, since the distance between sub-pixel units in the row direction is lower than the distance between sub-pixel units in the column direction, as shown by dotted line 262 in FIG. 2C, the RBG sub-pixel units at the r1 row×c3 column, row r2×column c2, and row r2×column c4 may form a single pixel. Another pixel constituted of RBG sub-pixels at the r3 row×c2 column, row r4×column c4, and row r3×column c4 is shown by dotted line 264 in FIG. 2C. In this way, by regulating the distance between two sub-pixels that are part of a pixel, it may be a feasible to fabricate display substrate using a FMM process wherein the sub-pixel units are not too close, thereby reducing edge aliasing caused by undesired color mixing.

Since the human eye is more sensitive to green, the area of the green sub-pixel unit G may be smaller than the area of the red sub-pixel unit R. and the area of the green sub-pixel unit G may be smaller than the area of the blue sub-pixel unit B. In this way, it can be ensured that the color of the display panel is uniform and not distorted (such as being greenish).

When the display substrate is an organic light emitting diode (OLED) display substrate, each layer material of the OLED can be prepared by an evaporation process. The area of the green sub-pixel unit is smaller than the area of the sub-pixel unit of any other color, and a material of a luminescent layer of the green sub-pixel unit is not mixed with materials of the luminescent layers of the sub-pixel unit of other colors, thereby facilitating fabrication of a mask used in the fine metal mask (FMM) method. For production of high pixel density OLED, the FMM is commonly used as the mask in vapor deposition of organic luminophore (in three primary colors such as red, green, and blue) within the pixel (wherein each sub-pixel therein is of a different color). Typically, a FMM is thin and has a low coefficient of thermal expansion.

In the present application, the display substrate may be a display substrate for a liquid crystal display (LCD) panel, or may be a display substrate for an organic light emitting diode (OLED) display panel.

Figure 3:
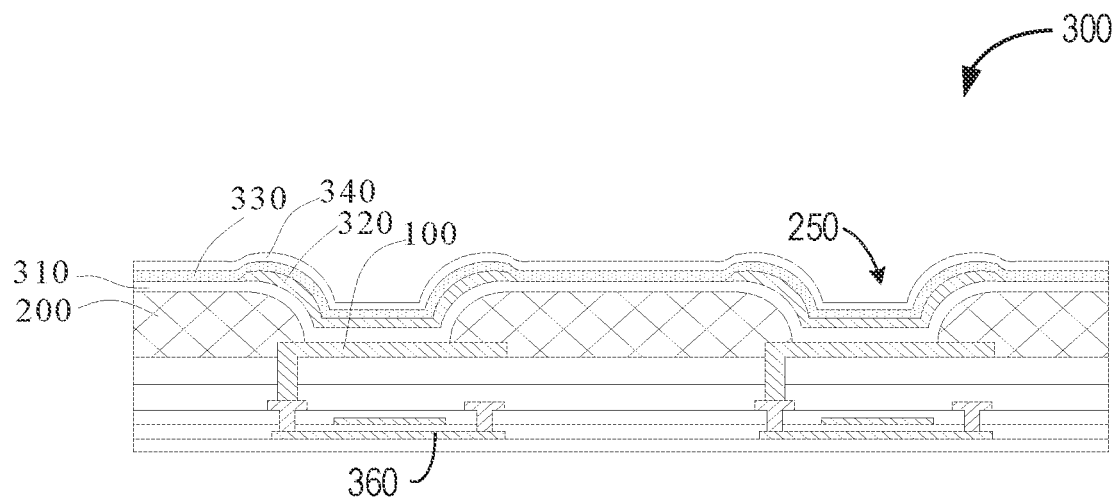
FIG. 3 is a cross-sectional view of the display substrate provided by the present application.
Figure 4:
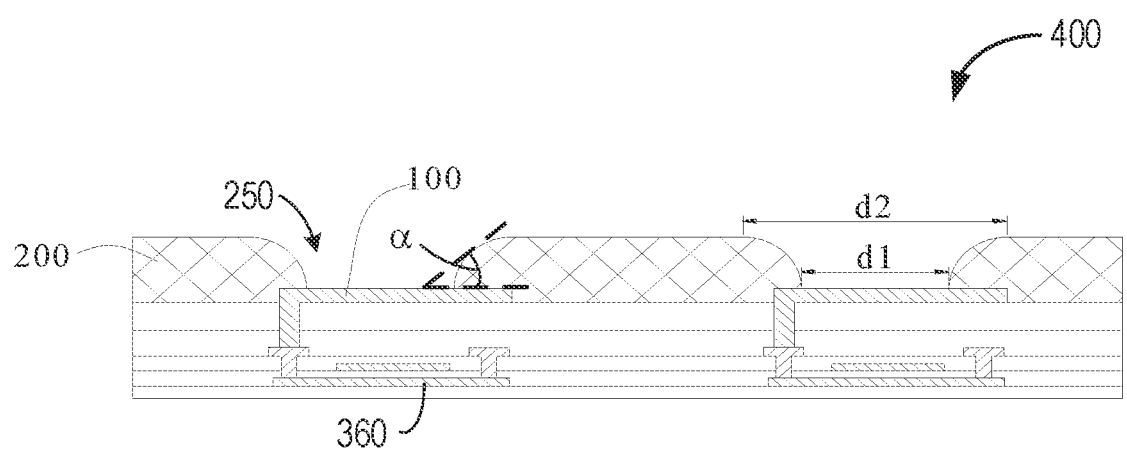
FIG. 4 is a cross-sectional view showing a portion of the display substrate provided by the present application, wherein a positional relationship between a predetermined layer of a pixel and an anode of an organic light emitting diode is shown.

In one embodiment, the display substrate is a display substrate for an organic light emitting diode display panel. Accordingly, as shown in FIG. 3 and FIG. 4, each of the display substrates 300 and 400 may include a pixel defining layer 200 where an organic layer between an anode and a cathode can be electrically connected.

The pixel defining layer may include may include a plurality of sub-pixel openings 250. The sub-pixel unit includes an OLED, and the plurality of sub-pixel openings 250 are in one-to-one correspondence with the plurality of sub-pixel units, and at least a portion of the OLED is located in the corresponding sub-pixel opening 250.

Correspondingly, the display substrate 300, 400 further includes a pixel circuit 360 for driving the OLED to emit light, and each of the OLEDs have a corresponding pixel circuit 360. In the embodiment shown in FIG. 3, a hole transport layer 310, a light emitting layer 320, an electron transport layer 330, and the cathode 340 of the OLED are located within the sub-pixel opening 250. The anode 100 of the OLED is located below the pixel defining layer 200, and a portion is exposed from the sub-pixel opening to conform to a functional layer of the OLED. It should be noted that the OLED may further include other organic functional layers, such as an electron injection layer, a hole injection layer, an electron blocking layer, a hole blocking layer, etc., and the embodiment is merely exemplified and not limited to being organic.

Specifically, the pixel defining layer 200 is located above the layer where the pixel circuit 360 is located, and the anode 100 of the OLED is located between the pixel defining layer 200 and the layer where the pixel circuit 360 is located.

Figure 6:
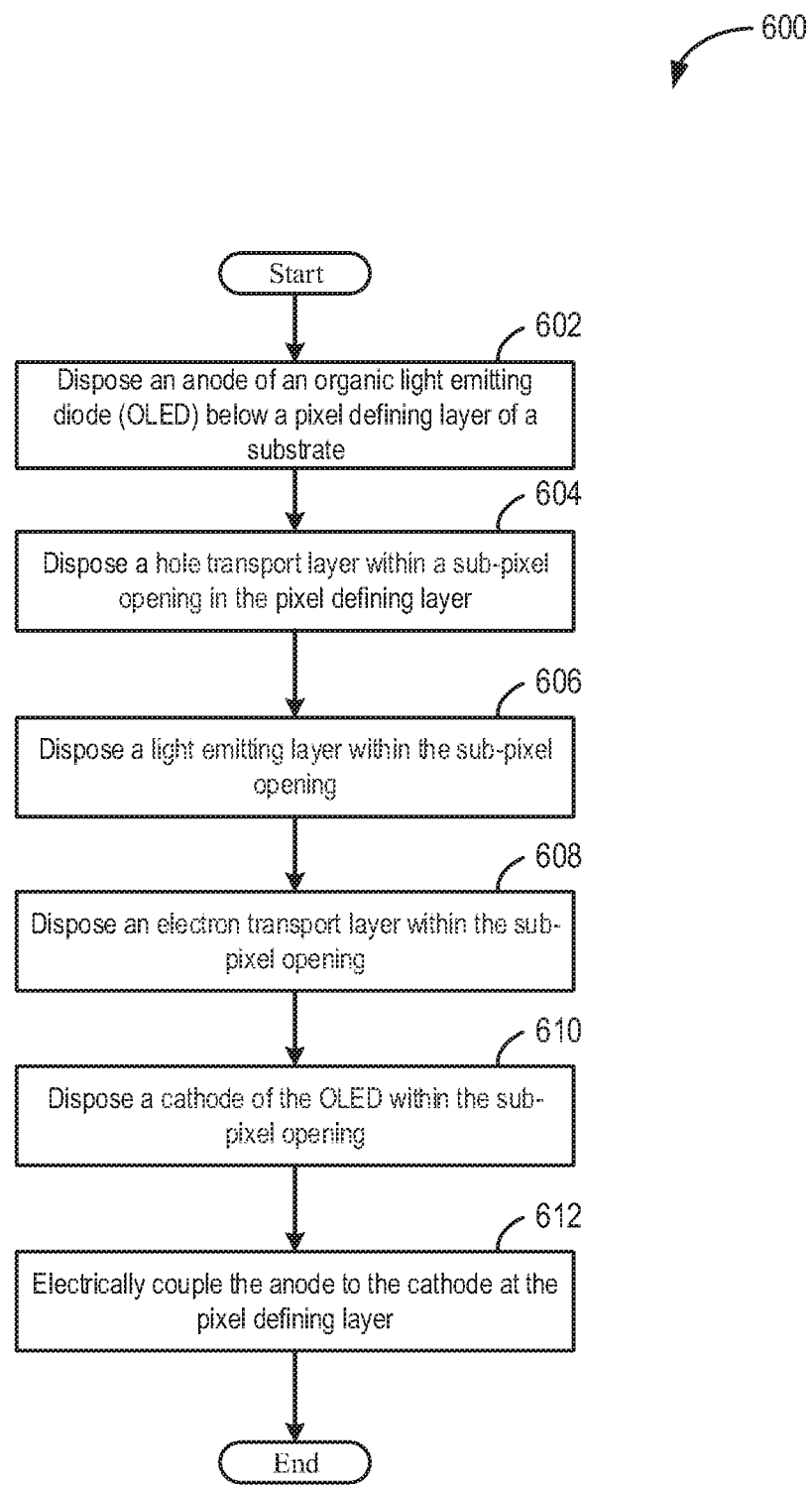
FIG. 6 shows a flow diagram of a fabrication method for sub-pixel units in a display substrate provided by the present application.

FIG. 6 shows an example flow-chart 600 of a fabrication method for sub-pixel units in a display substrate. At 602, an anode (such as anode 100 in FIG. 3) of an organic light emitting diode (OLED) may be disposed below a pixel defining layer (such as pixel defining layer 200 in FIG. 3) of a substrate (such as substrate 300 in FIG. 3). The anode may be positioned between the pixel defining layer and a layer where the pixel circuit (such as pixel circuit 360 in FIG. 3) is located. The pixel circuit powers the OLED to emit light. At 604, a hole transport layer (such as hole transport layer 310 in FIG. 3) may be disposed within a sub-pixel opening (such as sub-pixel opening 250 in FIG. 3) in the pixel defining layer. At 606, a light emitting layer (such as light emitting layer 320 in FIG. 3) may be disposed over the hole transport layer within the sub-pixel opening. At 608, an electron transport layer (such as electron transport layer 330 in FIG. 3) may be disposed over the light emitting layer within the sub-pixel opening. At 610, a cathode of the OLED (such as cathode 340 in FIG. 3) may be disposed over the electron transport layer within the sub-pixel opening. In this way, the hole transport layer, the light emitting layer, the electron transport layer, and the cathode may be stacked on a sub-pixel opening. At 612, the anode may be electrically coupled to the cathode at the pixel defining layer. Further the anode and/or cathode may be electrically coupled to the pixel circuit located below the anode.

In this way, a display for a display device may be activated by disposing each of a hole transport layer, a light emitting layer, an electron transport layer, and a cathode of an organic light emitting diode (OLED) within a sub-pixel opening on a pixel defining layer of a substrate; and disposing an anode of the OLED below the pixel defining layer, the cathode electrically connected to the anode at the pixel defining layer; wherein deposition within the sub-pixel opening includes deposition on a bottom wall of the sub-pixel opening and a sidewall of the sub-pixel opening, the sidewall being at an angle with the bottom wall.

The pixel defining layer 200 may cover an edge portion of the anode 100, and the edge portion of the anode 100 has a connection terminal electrically connected to a driving transistor circuit (not shown) under the pixel defining layer 200. Further, the connection terminal is electrically connected to the drain of a driving transistor circuit through a hole. Each layer of the driving transistor circuit located above the display substrate includes a thin film transistor (TFT) of a top gate structure, and a lowermost layer of the driving transistor circuit is a semiconductor layer, which in turn includes an insulating layer, a source/drain electrode, a gate electrode, a gate insulating layer, and a flat layer.

In the present application, a material of the pixel defining layer is not particularly limited. For example, the pixel defining layer can be made using a polyimide material. In one embodiment, an opening area of a lower portion of a sub-pixel opening 250 does not exceed an opening area of an upper portion of the sub-pixel opening 250. It should be noted that "upper" and "lower" herein are the upper and lower directions in FIGS. 3 and 4. In FIG. 4, a size d1 of the bottom of the sub-pixel opening 250 is smaller than a size d2 of the top of the sub-pixel opening 250.

The sub-pixel opening 250 is disposed such that a surface area of the lower portion is smaller than a surface area of the upper portion of the sub-pixel opening 250, and a sidewall of the sub-pixel opening 250 is a slope (an angle, α, exists between the sidewall of the sub-pixel opening 250 and a bottom wall of the sub-pixel opening 250). When the display substrate is manufactured, a functional layer of the OLED can be formed by an evaporation process using a FMM mask. The respective functional layers of the OLED may be located above the sub-pixel opening 250. Since the size d1 of the bottom of the sub-pixel opening 250 is smaller, the spacing between the bottoms of adjacent sub-pixel openings 250 is larger, which is convenient for manufacturing. During the evaporation process, the material evaporates, and each layer of the OLED is formed on the bottom wall of the sub-pixel opening 250 as well as on the sidewall of the sub-pixel opening 250. Therefore, a surface area of each of the light-emitting elements of the sub-pixel unit is larger than a surface area of the bottom of the sub-pixel opening 250, so that even during processing and manufacturing, it is possible to increase the aperture ratio of the display substrate and improve the display effect. In this way, the actual light-emitting area is larger than the surface area of the bottom of the sub-pixel opening 250 with the slopes on both sides of the sub-pixel opening 250 also emitting light. Moreover, since a distance between the sub-pixel openings 250 is large, light-emitting layers of different sub-pixel units are also far apart, and color mixing does not occur.

Referring to FIGS. 1-2A-B, in each sub-pixel, an area inside dashed lines correspond to an area of the bottom surface while an area inside outer solid lines corresponds to a total area of the combined area of the bottom surface and the sloping side walls (which is the light emitting area). A ratio of the area within the dashed lines and the area within the solid lines may be between about 1 and 1.6 with the specific ratio depending on an applied current and the slope angle of the pixel defining layer 200.

For ease of manufacture, the sidewall of the sub-pixel opening has a slope angle, α, between 20° and 40° with the bottom wall of the sub-pixel opening, which ensures that the display substrate has a high aperture ratio and ensures continuity of functional layers on the sidewall. The slope angle, α, may also be measured between a line perpendicular to the bottom wall of the sub-pixel opening and the sidewall of the sub-pixel opening.

As an example, the sidewall of the sub-pixel opening has a slope angle between 26° and 27° with the bottom wall of the sub-pixel opening. As an example, the ratio of the opening area of the upper portion of the sub-pixel opening to the opening area of the lower portion of the sub-pixel opening is between 1 and 1.6.

In a specific embodiment of the array substrate including a red sub-pixel unit, a green sub-pixel unit, and a blue sub-pixel unit, the OLED comprises a red OLED, a green OLED, and a blue OLED.

For light-emitting diodes of different colors, materials of the light-emitting layers are different from each other. In order to adapt to different materials, preferably, the ratio of the opening area of the upper portion of the sub-pixel opening corresponding to the red OLED to the opening area of the lower portion of the sub-pixel opening corresponding to the red OLED is between 1.45 and 1.55.

Correspondingly, the ratio of the opening area of the upper portion of the sub-pixel opening corresponding to the blue OLED to the opening area of the lower portion of the sub-pixel opening corresponding to the blue OLED is between 1.45 and 1.55.

Correspondingly, the ratio of the opening area of the upper portion of the sub-pixel opening corresponding to the green OLED to the opening area of the lower portion of the sub-pixel opening corresponding to the green OLED is between 1.2 and 1.3. In this way, the sub-pixel opening corresponding to the green OLED is overall smaller than that of the sub-pixel openings corresponding to blue or green OLED. In the embodiment shown in FIGS. 1 and 2, the area of the red sub-pixel unit R is smaller than the area of the blue sub-pixel unit B. As an embodiment of the present application, as shown in FIG. 1, an opening or cross-sectional shape of the sub-pixel opening is a rectangle.

In the present application, the arrangement of sub-pixel units of different colors is not particularly limited.

Figure 5:
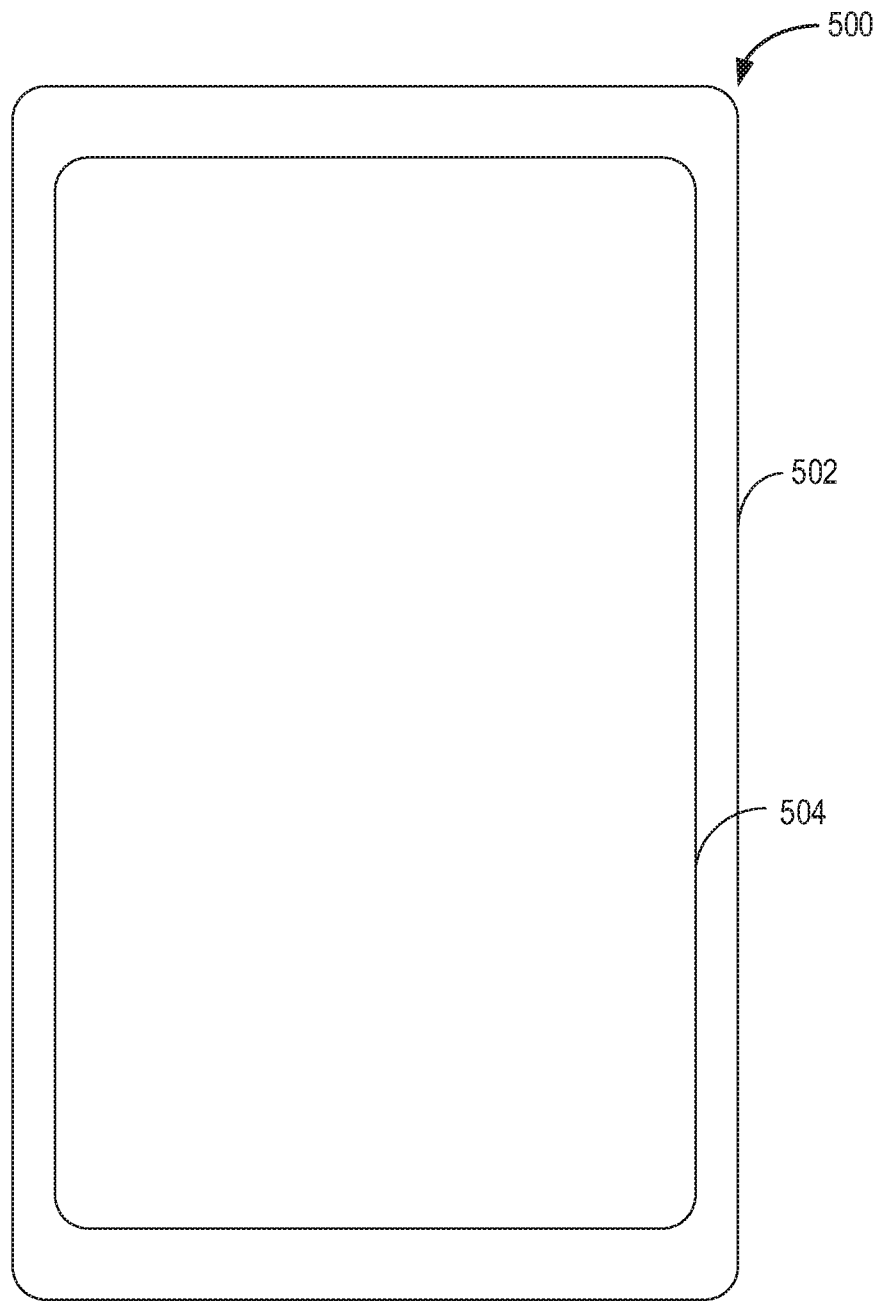
FIG. 5 shows a schematic diagram of an organic light emitting diode display device according to an embodiment of the present disclosure.

FIG. 5 depicts a schematic diagram 500 of a display device 502 having a display 504, where the display 504 comprises the substrate (e.g., substrate 300 in FIG. 3) described hereinabove. The display 504 includes components described in reference to FIGS. 1-4 such as an array of sub-pixel units housed in corresponding sub-pixel openings, a plurality of sub-pixel units forming a pixel. Different images may be displayed in the display 504 by controlling the illumination of respective sub-pixel units. As previously described, by increasing spacing between two adjacent sub-pixel units and arranging the sub-pixel units in solid-colored columns and mixed-colored columns, when displaying with the display device, sharp, well defined, edges can be achieved and the edges do not appear jagged. Further, when the process of manufacturing the display device is a printing process such as inkjet printing, the technical solution described in the present application can also be applied.

It should be noted that, in the present disclosure, "connected" and "connection" refer to electrical connection; "disposed/located in the same layer" means that two structures are made by a synchronous process at the time of fabrication, and do not necessarily mean a distance to the array substrate is equivalent; and an "extension direction" of a signal line refers to an overall course of the signal line.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

It is to be understood that the above embodiments are merely exemplary embodiments employed to explain the principles of the inventive concepts, but the inventive concepts are not limited thereto. Various modifications and improvements can be made by those skilled in the art without departing from the spirit and scope of the disclosure, and such modifications and improvements are also considered to be within the scope of the disclosure.

The invention claimed is:

1. A display substrate, comprising:
a plurality of sub-pixel units arranged in a plurality of rows and a plurality of columns, the plurality of columns of the sub-pixel units comprising alternatingly arranged solid color sub-pixel unit columns and mixed color sub-pixel unit columns,
the solid color sub-pixel unit columns including a plurality of sub-pixel units corresponding to a same color,
adjacent sub-pixel units in a row direction corresponding to different colors,
wherein sub-pixel units on each side in a row direction of a sub-pixel unit in a solid color sub-pixel unit column are of different colors,
a pixel defining layer having a plurality of sub-pixel openings, the plurality of the sub-pixel openings corresponding with the plurality of sub-pixel units, and
wherein each of the sub-pixel units comprises an organic light-emitting diode and at least a portion of the organic light-emitting diode is located in the corresponding sub-pixel opening, the organic light-emitting diodes include red organic light-emitting diodes, green organic light-emitting diodes, and blue organic light-emitting diodes, and wherein a ratio of an opening area of an upper portion of a sub-pixel opening corresponding to the green organic light-emitting diodes to an opening area of a lower portion of the sub-pixel opening corresponding to the green organic light-emitting diodes is between 1.2 and 1.3, and a ratio of an opening area of an upper portion of a sub-pixel opening corresponding to the blue organic light-emitting diodes to an opening area of a lower portion of the sub-pixel opening corresponding to the blue organic light-emitting diodes is between 1.45 and 1.55.

2. A display substrate, comprising:

a plurality of sub-pixel units arranged in a plurality of rows and a plurality of columns, the plurality of columns of the sub-pixel units comprising alternatingly arranged solid color sub-pixel unit columns and mixed color sub-pixel unit columns, the solid color sub-pixel unit columns including a plurality of sub-pixel units corresponding to a same color, adjacent sub-pixel units in a row direction corresponding to different colors, wherein sub-pixel units on each side in a row direction of a sub-pixel unit in a solid color sub-pixel unit column are of different colors, a pixel defining layer having a plurality of sub-pixel openings, the plurality of the sub-pixel openings corresponding with the plurality of sub-pixel units, wherein a ratio of an opening area of an upper portion of a sub-pixel opening corresponding to green organic light-emitting diodes to an opening area of a lower portion of the sub-pixel opening corresponding to the green organic light-emitting diodes is between 1.2 and 1.3, and a ratio of an opening area of an upper portion of a sub-pixel opening corresponding to red organic light-emitting diodes to an opening area of a lower portion of the sub-pixel opening corresponding to the red organic light-emitting diodes is between 1.45 and 1.55.

3. The display substrate according to claim 2, wherein in a pixel unit, at least one sub-pixel unit has a relationship with at least one sub-pixel unit of a different color of an adjacent row, the relationship including a pitch of two sub-pixel units in a row direction being smaller than a pitch of the two sub-pixel units in a column direction and wherein in the pixel unit, the at least one sub-pixel unit is a green sub-pixel unit, and the at least one sub-pixel unit of a different color is a blue sub-pixel unit or a red sub-pixel unit.

4. The display substrate according to claim 3, wherein the pixel unit includes the green sub-pixel unit, the red sub-pixel unit, and the blue sub-pixel unit, and the green sub-pixel unit has the relationship with each of the red sub-pixel unit and the blue sub-pixel unit.

5. The display substrate according to claim 2, wherein the solid color sub-pixel unit columns comprise green sub-pixel units corresponding to green color, and the mixed color sub-pixel unit columns comprise alternating red sub-pixel units corresponding to red color and blue sub-pixel units corresponding to blue color.

6. The display substrate according to claim 5, wherein an area of a green sub-pixel unit is smaller than an area of a red sub-pixel unit, and an area of a green sub-pixel unit is smaller than an area of a blue sub-pixel unit area.

7. The display substrate according to claim 6, wherein the area of the red sub-pixel unit is smaller than the area of the blue sub-pixel unit, and wherein each of an opening shape of the red sub-pixel unit and an opening shape of the blue sub-pixel unit are rectangular.

8. The display substrate according to claim 6, wherein an opening shape of the green sub-pixel unit is a rectangle or an ellipse, if the opening shape is green sub-pixel unit is an ellipse, an angle is formed between a long axis of the ellipse and a column direction, and a direction of a long axis of any one of the green sub-pixel units is opposite to a direction of a long axis of an adjacent green sub-pixel unit.

9. The display substrate according to claim 2, wherein a ratio of an opening area of an upper portion of a sub-pixel opening corresponding to blue organic light-emitting diodes to an opening area of a lower portion of the sub-pixel opening corresponding to the blue organic light-emitting diodes is between 1.45 and 1.55.

10. A display substrate, comprising:

a plurality of sub-pixel units arranged in a plurality of rows and a plurality of columns, wherein the plurality of columns of the sub-pixel units comprises alternatingly arranged solid color sub-pixel unit columns and mixed color sub-pixel unit columns, the solid color sub-pixel unit columns including a plurality of sub-pixel units corresponding to a same color, adjacent sub-pixel units in a row direction correspond to different colors, and sub-pixel units on each side in a row direction of a sub-pixel unit in a solid color sub-pixel unit column are of different colors, wherein the display substrate comprises a pixel defining layer having a plurality of sub-pixel openings, the plurality of the sub-pixel openings being in one-to-one correspondence with the plurality of sub-pixel units, wherein each of the sub-pixel units comprise an organic light-emitting diode and at least a portion of the organic light-emitting diode is located in the corresponding sub-pixel opening, wherein an opening area of a lower portion of the sub-pixel opening does not exceed an opening area of an upper portion of the sub-pixel opening, and wherein a ratio of an opening area of an upper portion of a sub-pixel opening corresponding to green organic light-emitting diodes to an opening area of a lower portion of the sub-pixel opening corresponding to the green organic light-emitting diodes is between 1.2 and 1.3, and a ratio of an opening area of an upper portion of a sub-pixel opening corresponding to red organic light-emitting diodes to an opening area of a lower portion of the sub-pixel opening corresponding to the red organic light-emitting diodes is between 1.45 and 1.55.

11. The display substrate according to claim 10, wherein a ratio of an opening area of an upper portion of a sub-pixel opening corresponding to blue organic light-emitting diodes to an opening area of a lower portion of the sub-pixel opening corresponding to the blue organic light-emitting diodes is between 1.45 and 1.55.

* * * * *